United States Patent [19]

Sakumoto et al.

[11] Patent Number: 5,609,956
[45] Date of Patent: Mar. 11, 1997

[54] ADHESIVE TAPE FOR ELECTRONIC PARTS AND LIQUID ADHESIVE

[75] Inventors: Yukinori Sakumoto; Takeshi Hashimoto; Takeshi Nishigaya; Fumiyoshi Yamanashi, all of Shizuoka, Japan

[73] Assignee: Tomoegawa Paper Co., Ltd., Tokyo, Japan

[21] Appl. No.: 623,090

[22] Filed: Mar. 28, 1996

[30] Foreign Application Priority Data

Mar. 30, 1995 [JP] Japan .................................. 7-095917

[51] Int. Cl.$^6$ .................................. B32B 7/10; B32B 27/28
[52] U.S. Cl. .................................. 428/352; 428/41.3; 428/41.4; 428/41.8; 428/212; 428/354; 428/447; 428/451; 428/483; 428/511; 428/355 CN
[58] Field of Search .................................. 428/41.3, 41.4, 428/41.8, 212, 352, 354, 355, 447, 451, 483, 511

[56] References Cited

U.S. PATENT DOCUMENTS

| | | | |
|---|---|---|---|
| 5,446,080 | 8/1995 | Shima et al. | 524/99 |
| 5,494,757 | 2/1996 | Sakumoto et al. | 428/447 |

FOREIGN PATENT DOCUMENTS 7-126591  10/1993  Japan .

*Primary Examiner*—Ana Woodward
*Attorney, Agent, or Firm*—Lowe, Price, LeBlanc & Becker

[57] ABSTRACT

Adhesive tapes which can be adhered and cured at a relatively low temperature, keeps enough electric insulation in case of adhering to the leadframe of semiconductor devices. The adhesive tape comprises a releasing film and an adhesive layer provided on a surface of said releasing film, said adhesive layer being semi-cured into a B-stage and composed of:

(a) a piperazinylethylaminocarbonyl-containing butadiene-acrylonitrile copolymer having a weight average molecular weight of 10,000–200,000, an acrylonitrile content of 5–50% by weight and an amino equivalent of 500–10,000, represented by the formula (I):

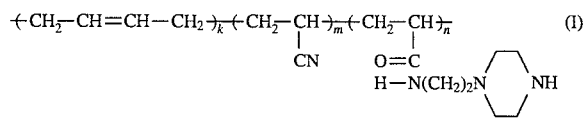

wherein, k, m, and n are molar ratios and taking n as 1, k is a number of 3–175, and m is a number of 0.3 to 93; and (b) a compound having at least two maleimide groups, the ratio of component (b) based on 100 parts by weight of component (a) being in a range of 10 to 900 parts by weight, and said adhesive layer being composed of at least two semi-cured layers having each a different status of semi-cure.

10 Claims, 2 Drawing Sheets

ADHESIVE TAPE FOR ELECTRONIC PARTS AND LIQUID ADHESIVE

BACKGROUND OF THE INVENTION

1) Field of the Invention

The present invention relates to adhesive tapes for electronic parts to be used for adhering between parts around leadframes making up a semiconductor device, e.g., lead pins, semiconductor chip mounted substrates, radiation plates, semiconductors themselves.

2) Description of the Related Art

Conventionally, adhesive tapes for fixing a leadframe, TAB tapes, etc., are-used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strengh immediately after taping and heat resistance enough for withstanding thermal process at the stages of assembling semiconductor devices. Conventionally, the adhesive tapes for use in such an application include adhesive tapes applying on a support film of a polyimide film, etc., an adhesive comprising a synthetic rubber resin such as polyacrylonitrile, polyacrylate or acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are molded with the semiconductor chip 1 and an adhesive layer 6 and together with a bonding wire 4, they are molded with a resin 5. In FIG. 3, the device has a construction in which a semiconductor chip 1 is mounted on a die pad, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems such as insufficient heat resistance. Also, in the case of the application of polyimide resin, conditions of temperature and pressure for taping and conditions for curing are severe so that the metal material, such as leadframe, are damaged. Consequently, it has been desired to develop an adhesive for electronic parts which can be coated and cured at a relatively low temperature, and which has sufficient heat resistance and reliability, etc.

The present inventors have proposed an adhesive tape using an ahdesive comprising a piperazinylethylaminocarbonyl-containing butadiene-acrylonitrile copolymer represented by the under-mentioned formula (I) and a compound having at least 2 maleimide groups (Japanese Patent Application Laid-Open 126591/1995), whereby the above problems are dissolved.

However, there are still problems in this adhesive tape. Incase of using an adhesive tape comprising an adhesive layer on a heat resistant film, there are problems that the heat resistant film is delaminated from the adhesive layer at their interface because of insufficient affinity between the heat resistant film and the adhesive layer, and delamination is easily caused between the interface between the heat resistant film and the adhesive layer or between the adhesive layer and the substance to be adhered such as metal plane, etc., because they have each a different thermal expansion coefficient. Also, in case of using an adhesive tape composed of an adhesive monolayer, there is the problem, when adhesion is carried out with heat under pressure, that pointed ends of the leadframe are embeded in and went through the adhesive layer to contact with the surface of the substance to be adhered, by which reliability of the semi-conductor devices fall for lack of the electric insulation. In order to avoid such problems, when the adhesive layer is cured so as to inhibit contact of the pointed ends of the leadframe with the surface of the substance to be adhered, temporary adhesion of the adhesive tape to the substance to be adhered is difficult to carry out.

SUMMARY OF THE INVENTION

The present invention has been done in order to solve the above described problems. The object of the present invention is, therefore, to provide an adhesive tape which can be adhered and cured at a relatively low temperature, can keep enough electric insulation in case of adhering to the leadframe, and can produce electronic parts with enough reliability.

The first adhesive tape for electronic parts of the present invention comprises a releasing film and an adhesive layer provided on a surface of said releasing film, said adhesive layer being semi-cured into a B-stage and composed of:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

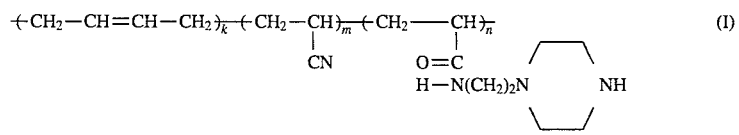

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

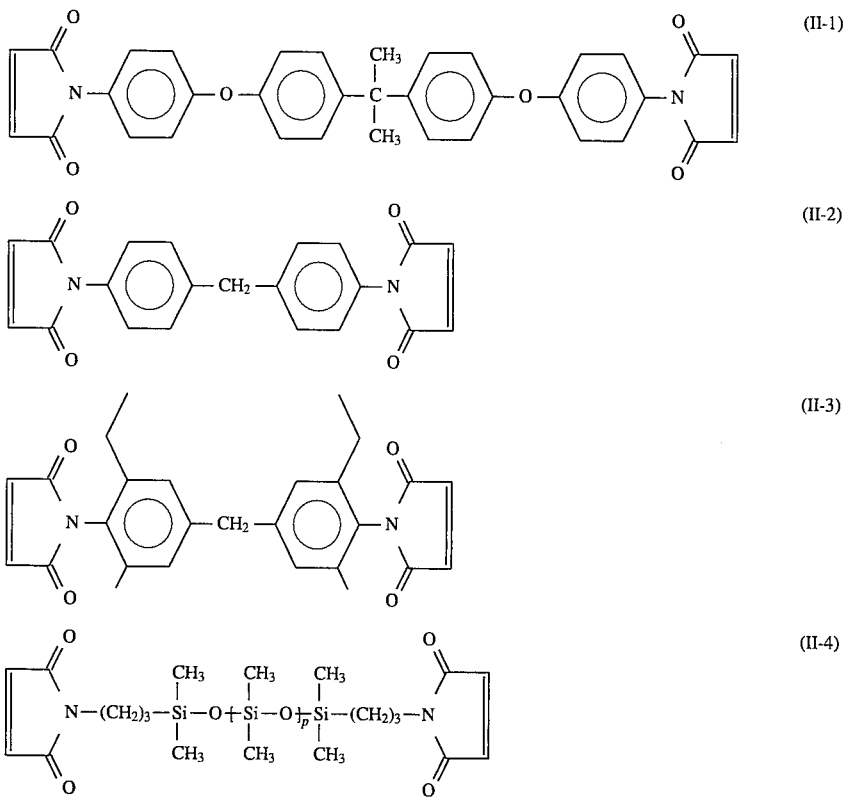

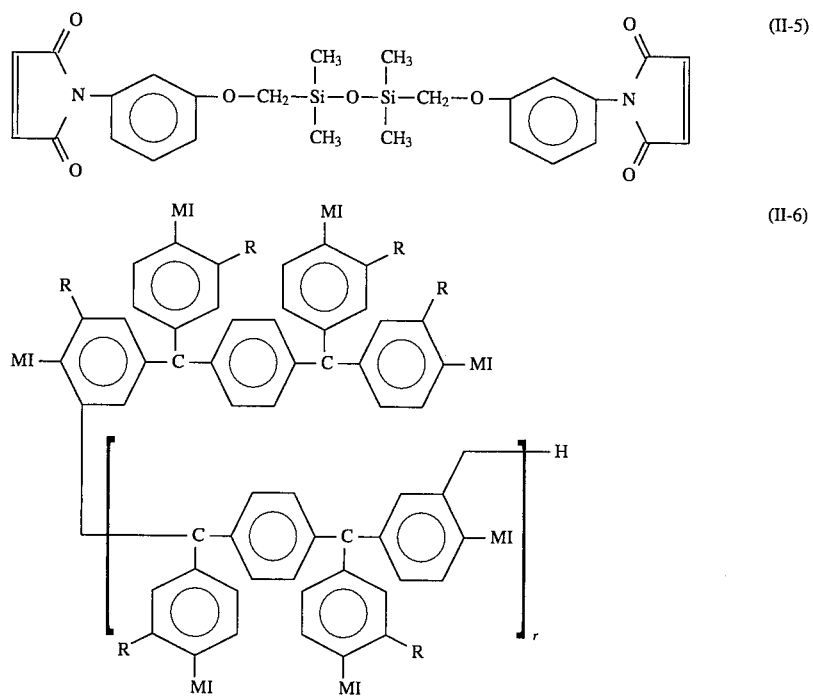

wherein p is an integer of from 0 to 7, wherein MI=maleimide group, R=H or $CH_3$, and r=1–5; the ratio of component (b) based on 100 parts by weight of component (a) being in a range of 10 to 900 parts by weight, and said adhesive layer being composed of at least two semi-cured layers which are cured into a B-stage and have each a different status of semi-cure.

The second adhesive tape for electronic parts of the present invention comrises a release film laminated on the surface of the adhesive layer in the first adhesive tape for electronic parts.

The third adhesive tape for electronic parts of the present invention comrises a release film and an adhesive layer provided on a surface of said release film, said adhesive layer being composed of:

(a) the above-mentioned piperazinylethylaminocarbonyl-containing butadiene-acrylonitrile copolymer of the above-mentioned component (a),
(b) a compound having at least two maleimide groups of the above-mentioned component (b), and
(c) a diamine compound represented by formula (III):

$$H_2N-R^1-NH_2 \quad (III)$$

wherein $R^1$ is a divalent aliphatic, aromatic, or alicyclic group,
or an amino-containing polysiloxane having a weight average molecular weight of 200–7,000 represented by the formula (IV):

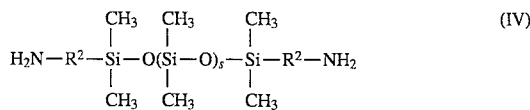

wherein $R^2$ is a divalent aliphatic, aromatic, or alicyclic group, and s is an integer of from 0 to 7,
the sum of components (b) and (c) based on 100 parts by weight of component (a) being 10 to 900 parts by weight, and the mol equivalent of the maleimide group in component (b) per mol equivalent of the amino group in component (c) being 1 to 100 mol equivalent, and said adhesive layer being composed of at least two semi-cured layers which are cured into a B-stage and have each a different status of semi-cure.

The fourth adhesive tape for electronic parts of the present invention comprises a release film laminated on the surface of the adhesive layer in the third adhesive tape for electronic parts.

DETAILED DESCRIPTION OF PREFERRED EMBODIMENTS

Figure 1:
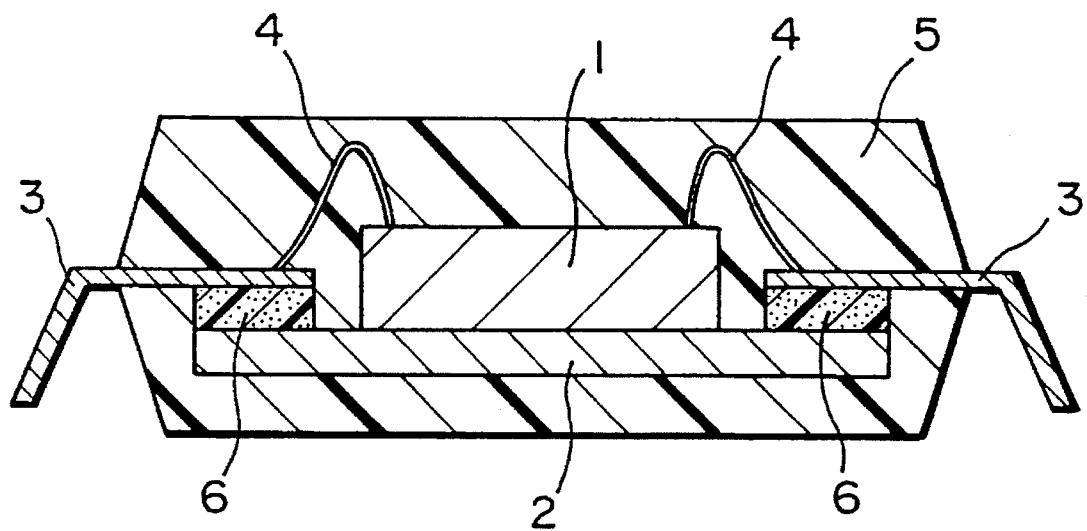
FIG. 1 is a cross-sectional view showing one example of a resin-molded semiconductor device constructed using an adhesive tape of the present invention or a conventional adhesive tape.
Figure 2:
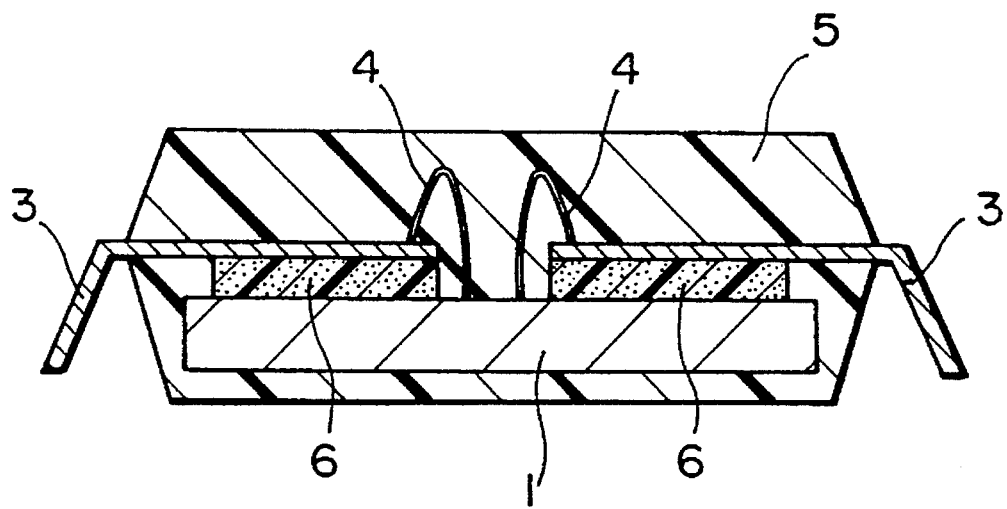
FIG. 2 is a cross-sectional view showing another example of a resin-molded semiconductor device constructed using an adhesive tape of the present invention or a conventional adhesive tape.
Figure 3:
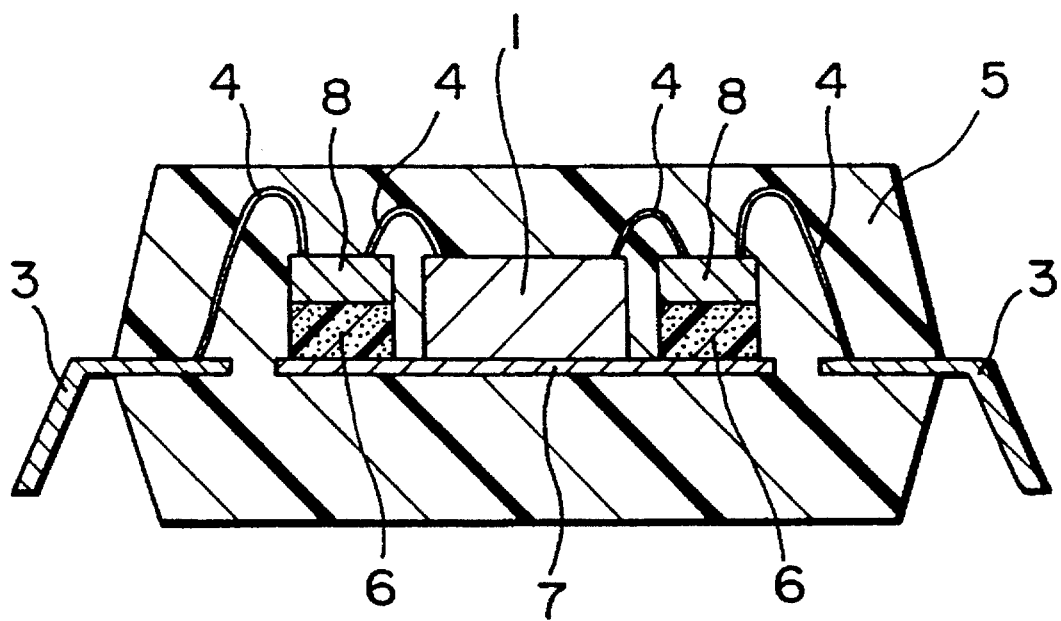
FIG. 3 is a cross-sectional view showing still another example of a resin-molded semiconductor device constructed using an adhesive tape of the present invention or a conventional adhesive tape.

The present invention will now be described in detail. First of all, a liquid adhesive (the first liquid adhesive) for use in the first and the second adhesive tapes for electronic parts of the present invention will now be described.

The piperazinylethylaminocarbonyl-containing butadiene-acrylonitrile copolymers having a weight average molecular weight of 10,000–200,000, an acrylonitrile content of 5–50% by weight, and an amino equivalent of 500–10,000, represented by the above-mentioned formula (I) to be used as component (a) is a novel substance, which can be synthesized by the condensation of carboxyl-containing butadiene-acrylonitrile copolymers represented by the following formula (V) with N-aminoethylpiperazine in the presence of, for example, a phosphite.

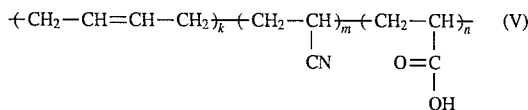

wherein, k, m, and n are molar ratios and taking n as 1, k is a number of 3–175, and m is a number of 0.3 to 93.

The piperazinylethylaminocarbonyl-containing butadiene-acrylonitrile copolymers which can be used in the present invention are those having a weight average molecular weight of 10,000 to 200,000, preferably 20,000 to 150,000, an acrylonitrile content of 5–50% by weight, preferably 10–40% by weight, and an amino equivalent of 500–10,000, preferably 1,000–8,000.

In this case, if the weight average molecular weight is lower than 10,000, the heat stability becomes insufficient leading to a decrease in heat resistance. If it is higher than 200,000, the solubility in the solvent becomes poor, and the melt viscosity is unduly increased, resulting in poor processability when used as an adhesive and in poor adhesive properties. If the acrylonitrile content is less than 5% by weight, the solubility in the solvent becomes low, and, conversely, if it is higher than 50% by weight, the insulating properties become unstable. If the amino equivalent is less than 500, the solubility in the solvent becomes low, while if it exceeds 10,000, the viscosity becomes too low when used as an adhesive by mixing with the maleimide compound, resulting in decreased processability.

In the first liquid adhesive, the ratio of component (a) to component (b) is set so that the ratio of component (b) based on 100 parts by weight of component (a) is in the range of 10–900 parts by weight, preferably 20–800 parts by weight. If the amount of component (b) is less than 10 parts by weight, the heat resistance of the adhesive after the coating and curing, especially Tg, and Young's modulus, is remarkably degraded, leading to an adhesive unsuitable for the intended purpose. Conversely, if it exceeds 900 parts by weight, the adhesive itself becomes brittle and has inferior processability, when cured into the B-stage.

The mixing of the above-mentioned components (a) and (b) is carried out in a solvent which dissolves both components. Examples of solvents which can be mentioned are N-dimethylformamide, N,N-dimethylacetamide, N-methylpyrrolidone, 1,3-dimethyl-2-imidazoline, dimethylsulfoxide, hexamethylphosphoric triamide, hexane, benzene, toluene, xylenes, methanol, ethanol, propanol, isopropanol, diethylether, tetrahydrofuran, methyl acetate, ethyl acetate, acetonitrile, dichloromethane, chloroform, carbon tetrachloride, chlorobenzene, dichlorobenzene, dichloroethane, trichloroethane, etc., and the type and amount of solvent are appropriately selected so that both components (a) and (b) are dissolved therein.

A liquid adhesive (the second liquid adhesive) for use in the third and the fourth adhesive tapes for electronic parts of the present invention comprises a diamine compound represented by the above formula (III) or an amino-containing polysiloxane compound having a weight average molecular weight of 200–7,000 represented by the above formula (IV) as component (c), in addition to components (a) and (b).

In this case, the ratios of component (a) to component (b) to component (c) are set such that the total amount of components (b) plus (c) is 10 to 900 parts by weight, preferably 20 to 800 parts by weight, based on 100 parts by weight of component (a). If the total amount of components (b) plus (c) is less than 10 parts by weight, the heat resistance of the adhesive layer, after coated and cured, especially Tg and the Young's modulus, is markedly decreased, making it unsuitable for an intended use. If it exceeds more than 900 parts by weight, the adhesive layer itself, when cured into the B stage, becomes brittle leading to poor processability.

It is necessary for the ratio of component (a) to component (b) to component (c) to be a molar equivalent of maleimide in component (b) in the range of 1 to 100 mol equivalent per mol of the amino group in component (c), and preferably the molar equivalent is set to be in the range of 1 to 80. If the molar equivalent of the meleimide in component (b) is less than 1, gelatinization takes place at the time of mixing so that the adhesive cannot be prepared. If it exceeds 100 molar equivalent, the adhesive layer itself, when cured into the B stage, becomes brittle leading to poor processability.

Examples of the diamine compounds represented by the above formula (III), which can be used as component (c) include N,N'-bis(2-aminophenyl)isophthalamide, N,N'-bis(3-aminophenyl)-isophthalamide, N,N'-bis(4-aminophenyl)isophthalamide, N,N'-bis(2-aminophenyl)-terephthalamide, N,N'-bis(3-aminophenyl)terephthalamide, N, N'-bis(4-aminophenyl)terephthalamide, N,N'-bis(2-aminophenyl)phthalamide, N,N'-bis(3-aminophenyl)phthalamide, N,N'-bis(4-aminophenyl)phthalamide, N,N'-bis(2-amino-phenyl)phthalamide, N,N'-bis(4-amino-3,5-dimethylphenyl)isophthalamide, N,N'-bis(4-amino-3,5-dimethylphenyl) terephthalamide, N,N'-bis(4-amino-3,5-dimethylphenyl)phthalamide, N,N'-bis(2-amino-n-butylphenyl)isophthalamide, N, N'-bis(4-amino-n-butylphenyl)isophthalamide, N, N'-bis(4-amino-n-hexylphenyl)isophthalamide, N, N'-bis(4-amino-n-dodecylphenyl)isophthalamide, m-phenylenediamine, p-phenylenediamine, m-tolylenediamine, 4,4'-diaminodiphenyl ether, 3,3'-dimethyl-4,4'-diaminodiphenyl ether, 3,3'-diaminodiphenyl ether, 3,4'-diaminodiphenyl ether, 4,4'-diaminodiphenyl thioether, 3,3'-dimethyl-4,4'-diaminodiphenyl thioether, 3,3'-diethoxy-4,4'-diaminodiphenyl thioether, 3, 3'-diaminodiphenyl thioether, 4,4'-diaminobenzophenone, 3,3'-dimethyl-4,4'-diaminobenzophenone, 3,3'-diaminodiphenylmethane, 4,4'-diaminodiphenylmethane, 3,3'-dimethoxy-4,4'-diaminodiphenylmethane, 2,2'-bis(4-aminophenyl)propane, 2,2'-bis(3-aminophenyl)propane, 4,4'-diaminodiphenylsulfoxide, 4,4'-diaminodiphenylsulfone, 3,3'-diaminophenylsulfone, benzidine, 3,3'-dimethylbenzidine, 3, 3'-dimethoxybenzidine, 3,3'-diaminobiphenyl, 2,2-bis [4-(4-aminophenoxy)phenyl]propane, 2,2-bis [3-methyl-4-(4-aminophenoxy)phenyl]propane, 2,2-bis [3-chloro-4-(4-aminophenoxy)phenyl]propane, 2,2-bis[3,5-dimethyl-4-(4-aminophenoxy)phenyl]propane, 1,1-bis[4-(4-aminophenoxy)phenyl]ethane, 1,1-bis[3-chloro-4-(4-aminophenoxy)phenyl]ethane, bis[4-(4-aminophenoxy)phenyl]methane, bis[3-methyl-4-(4-aminophenoxy)phenyl]methane, piperazine, hexamethylenediamine, heptamethylenediamine, tetramethylenediamine, p-xylenediamine, m-xylenediamine, methylheptamethylenediamine, 1,3-bis(4-aminophenoxy)benzene, 2,2-bis(4-aminophenyl)-1,1,1,3,3,3-hexafluoropropane, 2,2-bis[4-(4-aminophenoxy)phenyl]-1,1,1,3,3,3-hexafluoropropane, 4,4'-[1,4-phenylene-bis(1-methylethylidene)]bisaniline, 4,4'-[1,3-phenylene-bis(1-methylethylidene)] bisaniline, 4,4'-[1,4-phenylene-bis(1-methylethylidene)] bis(2,6-dimethylbisaniline), etc.

Examples of the amino-containing polysiloxane compound having a weight average molecular weight of 200–7,000 represented by the above formula (IV) include 1,3-bis(3-aminopropyl)-1,1,3,3-tetramethyldisiloxane, α, ω-bis(3-aminopropyl)polydimethylsiloxane, 1,3-bis(3-aminophenoxymethyl)-1,1,3,3-tetramethyldisiloxane, α, ω-bis-(3-aminophenoxy)polydimethylsiloxane, 1,3-bis[2-(3-aminophenoxymethyl)ethyl]-1,1,3,3-tetramethyldisiloxane, α, ω-bis[2-(3-aminophenoxy)ethyl]polydimethylsiloxane, 1,3-bis[3-(3-aminophenoxy)propyl]-1,1,3,3-tetramethyldisiloxane, α, ω-bis[3-(3-aminophenoxy)propyl]polydimethylsiloxane, etc.

The mixing of components (a), (b) and (c) are carried out in a solvent which dissolves these components. The solvents which can be used are those exemplified in the first liquid adhesive.

In order to accelerate the addition reaction between components (a) and (b) and the addition reaction between two or more of components (b), to the first and second liquid adhesives of the present invention may optionally be added diazabicyclooctane or organic peroxides such as methyl ethyl ketone peroxide, cyclohexane peroxide, 3,3,5-trimethylcyclohexanone peroxide, methylcyclohexanone peroxide, methylacetoacetate peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, t-butyl hydroperoxide, cumene hydroperoxide, di-isopropylbenzene hydroperoxide, p-mentane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, α, α'-bis(t-butylperoxy-m-isopropyl)benzene, 2,5-dimethyl-2,5-di-(t-butylperoxy)hexane, 2,5-dimethyl-2,5-di(t-butylperoxy)hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, di-isopropylperoxy dicarbonate, di-2-ethylhexylperoxy dicarbonate, di-n-propylperoxy dicarbonate, bis-(4-t-butylcyclohexyl)peroxy dicarbonate, di-myristylperoxy dicarbonate, di-2-ethoxyethylperoxy dicarbonate, dimethoxyisopropylperoxy dicarbonate, di(3-methyl-3-methoxybutyl)peroxy dicarbonate, di-allylperoxy dicarbonate, t-butylperoxy acetate, t-butylperoxy isobutyrate, t-butylperoxy pivalate, t-butylperoxy neodecanate, cumylperoxy neododecanate, t-butylperoxy 2-ethylhexanate, t-butylperoxy-3,5,5-trimethylhexanate, t-butylperoxy laurate, t-butylperoxy dibenzoate, di-t-butylperoxy isophthalate, 2,5-dimethyl-2,5-di-(benzoylperoxy) hexane, t-butylperoxy maleic acid, t-butylperoxy isopropylcarbonate, cumylperoxy octate, t-hexylperoxy neodecanate, t-hexylperoxy pivalate, t-butylperoxy neohexanate, t-hexylperoxy neohexanate, cumylperoxy neohexanate, acetylcyclohexylsulfonyl peroxide, and t-butylperoxy allylcarbonate; and imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-benzyl-2-phenylimidazole trimellitate, 1-benzyl-2-ethylimidazole, 1-benzyl-2-ethyl-5-methylimidazole, 2-ethylimidazole, 2-isopropylimidazole, 2-phenyl-4-benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimidazole, 1-cyanoethyl-2-methylimidazolium trimellitate, 1-cyanoethyl-2-ethyl-4-methylimidazolium trimellitate, 1-cyanoethyl-2-phenylimidazolium trimellitate, 2,4-diamino-6-[2'-methylimidazolyl-(1)']-ethyl-S-triazine, 2,4-diamino-6-[2'-ethyl-4-methylimidazolyl-(1)']-ethyl-S-triazine, 2,4-diamino-6-[2'- undecylimidazolyl-(1)']-ethyl-S-triazine, isocyanuric acid adduct of 2-methylimidazolium, isocyanuric acid adduct of 2-phenylimidazolium, isocyanuric acid adduct of 2,4-diamino-6-[2'-methylimidazole-(1)']-ethyl-S-triazine, 2-phenyl-4,5-dihydroxymethylimidazole, 2-phenyl-4methyl-5-hydroxymethylimidazole, 2-phenyl-4-benzyl-5-hydroxymethylimidazole, 4,4'-methylene-bis(2-ethyl-5-methylimidazole), 1-aminoethyl-2-methylimidazole, 1-cyanoethyl-2-phenyl-4,5-di(cyanoethoxymethyl)imidazole, 1-dodecyl-2-methyl-3-benzylimidazolium chloride, 4,4'-methylene-bis-(2-ethyl-5-methylimidazole), 2-methylimidazole-benzotriazole adduct, 1,2-dimethylimidazole-benzotriazole adduct, 1-aminoethyl-2-ethylimidazole, 1-(cyanoethylaminoethyl)-2-methylimidazole, N,N'-[2-methylimidazolyl-(1)-ethyl]-adipoyldiamide, N,N'-bis(2-methylimidazolyl-1-ethyl)urea, N-[2-methylimidazolyl-1-ethyl]-urea, N,N'-[2-methylimidazolyl-(1)-ethyl]dodecanedioyldiamide, N,N'-[2-methylimidazolyl-(1)-ethyl]eicosanedioyldiamide, 1-benzyl-2-phenylimidazole hydrochloride, and 1-cyanoethyl-2-phenyl-4,5-di(cyanoethoxylmethyl)imidazole; and reaction accelerators such as triphenyl phosphine. It becomes possible to precure the adhesive layer so as to have a desired status of semi-cure by controlling the amount of the above reaction accelerators.

Into the first and the second liquid adhesives in the present invention may be incorporated a filler having a particle size of about 1 μm in order to stabilize the taping characteristics of the adhesives. The filler content is set to be 4–40% by weight, preferably 9–24% by weight of the total solid content. If the content is less than 4% by weight, the effect for stabilizing the taping characteristics on taping becomes low. If it exceeds 40% by weight, the adhesion strength of the adhesive tape becomes low and the processability such as for lamination becomes poor.

Examples of fillers which can be used include silica, quartz powder, alumina, calcium carbonate, magnesium oxide, diamond powder, mica, fluorinated resin powder, zircon powder, etc.

The adhesive tapes according to the present invention can be produced using the above described the first and the second liquid adhesives. In the present invention, the adhesive layer formed on the release film is cured into a B-stage and is composed of at least two semi-cured layer having each a different status of semi-cure. Each of the semi-cured layers is prefered to have a thickness in a range from 5 to 100 μm, and particularly 10–50 μm. In the second and the forth adhesive tapes of the present invention, a release film is laminated on the surface of the adhesive layer.

The release film used has a thickness of 1 to 200 μm, preferably 10 to 100 μm, and can be used as a temporary substrate. Examples of available release films are polypropylene films, fluorine resin films, polyethylene films, polyethylene terephthalate films, paper and in some cases the above films to which release properties are imparted by silicone resin.

These release films preferably have a 90° peel release strength in the range from 0.01 to 7.0 g. If the release strength is lower than the above range, there is the problem of the release film being unwillingly released when feeded it. If it is higher than the above range, the release film cannot be smoothly released from the adhesive layer, leading to the problem in terms of processability.

In case that the adhesive layer consists of two semi-cured layers having each a different status of semi-cure, it is preferred that the semi-cured layer having a hihger status of semi-cure has a slipping velocity in a range of 0.01–0.3 μm/sec, and the semi-cured layer having a lower status of semi-cure has a slipping velocity in a range of 0.1–10.0 μm/sec, and that the slipping velocity ($V_1$) of the semi-cured layer having a higher status of semi-cure and the slipping velocity ($V_2$) of the semi-cured layer having a lower status of semi-cure has a relation of $V_2>V_1$.

If $V_1$ in the two semi-cured layer is beyond 0.3 μm/sec, the lead pins are embedded in the adhesve layer and easily contact with the substance to be adhered, such as a metal heat spreader, etc., by which it becomes difficult to keep electric insulation. On the other hand, if $V_1$ is below 0.01 μm/sec, there is the possibility of deteriorating the adhesive property of the adhesive layer to the substance to be adhered. If $V_2$ is beyond 10 μm/sec, the adhesive layer is forced out of edges of the adhesive tape to cause determination of the leadframe. On the other hand, it is not preferred that $V_2$ is below 0.1 μm/sec, because the adhesive property of the adhered matter to the leadframe deteriorates.

In case that the adhesive layer consists of three semi-cured layers having each a different status of semi-cure, the adhesive tape has the layer structure that a semi-curing layer having a lower status of semi-cure, a semi-cured layer having a higher status of semi-cure and a semi-cured layer having a lower degree are successively provided on the releasing film. Particularly preferred adhesive tapes are those having the construction that the first semi-cured layer having a lower status of semi-cure in a range of 0.1–10.0 μm/sec of the slipping velocity, a semi-cured layer having a higher status of semi-cure in a range of below 0.3 μm/sec, preferably 0.01–0.3 μm/sec of the slipping velocity, and the second semi-curing layer having a lower status of semi-cure in a range of 0.1–10.0 μm/sec of the slipping velocity are laminated in this order and that the slipping velocity ($V_3$) of the semi-cured layer having a higher status of semi-cure, the slipping velocity ($V_4$) of the first semi-cured layer having a lower status of semi-cure and the slipping velocity ($V_5$) of the second semi-cured layer having a lower status of semi-cure have the relations of $V_4>V_3$ and $V_5>V_3$.

If $V_3$ in three semi-cured layer exceeds 0.3 μm/sec, the lead pins are embedded in the adhesve layer and easily contact with the substance to be adhered, such as a metal heat spreader, etc., by which it becomes difficult to keep electric insulation. It is not preferred that $V_4$ or $V_5$ exceeds 10.0 μm/sec, because the adhesive layer is forced out of edges of the adhesive tape to cause determination of the leadframe or metal heat spreader etc. On the other hand, if it is below 0.1 μm/sec, the adhesive property of the adhered matter to the leadframe deteriorates.

The slipping velocity of the semi-cured layers cured into a B-stage is the value which means the status of semi-cure and is measured by the following method. Two samples are produced by cutting the tape to be measured into 5 mm×20 mm size. After one sample is put on the other sample so as to overlap only each edge part of 5 mm from the edge, they are bonded by passing through a pair of heating rolls of 150° C. at a roll rate of 1 m/min. After the resulted sample was kept at 23±3° C. and 65±5% RH for 48±12 hours, both ends of the bonded sample are chucked by a thermal mechanical analyzer (TM-3000, produced by Shinkuuriko Co.) and they are pulled in both directions under 5 g load while heating from 25° C. to 200° C. at rate of 10° C./min. Each sliding length (distance of movement) in the bonded part per unit time is measured and plotted. The sliding length (μm/sec) where the maximum sliding length per unit time occured is evaluated as the slipping velocity of the semi-cured layer.

In the following, the process for producing adhesive tapes for electronic parts of the present invention in which the above described the first and the second liquid adhesives are used will be explained.

The adhesive tapes for electronic parts are produced using the above mentioned liquid adhesive by forming at least two semi-cured layers having each a different status of semi-cure on a surface of a release film. In this case, in order to form at least two semi-cured layers having each a different status of semi-cure, various kinds of processes can be adopted by combining various treatments, such as addition of the reaction accelerators, application of the liquid adhesives, pre-curing condition after drying, lamination of adhesive layers, etc.

Specifically, in case of forming, for example, the adhesive layer of two-layer structure, it is possible to use the following processes, that is, (1) a process which comprises applying the above mentioned liquid adhesive to a surface of two release films, drying to form two uncured adhesive sheets, curing them under each a different condition to form two B-stage cured adhesive sheets having each a different status of semi-cure, and bonding these two adhesive sheets, (2) a process which comprises applying the above mentioned liquid adhesive to a surface of two release films, curing by heating directly them to form two B-stage cured adhesive sheets having each a different status of semi-cure, and bonding these two adhesive sheets, (3) a process which comprises superposing an uncured adhesive sheet prepared by applying the above mentioned liquid adhesive to a surface of the release film on a B-stage cured adhesive sheet prepared by curing the above uncured adhesive sheet, and precuring the laminate, (4) a process which comprises applying the above-mentioned liquid adhesive to a surface of the release film to produce a B-stage cured adhesive sheet having a suitable status of semi-cure, applying an uncured liquid adhesive to the surface thereof and pre-curing it, (5) a process which comprises preparing two uncured adhesive sheets by applying two liquid adhesives having each the same composition except for the amount of the reaction accelerator, precuring these two adhesive sheet under the same condition, and bonding both of them, and (6) a process which comprises applying the liquid adhesive in the present invention to a surface of the release film, or precuring it to form a B-stage cured adhesive sheet having a suitable status of semi-cure, applying thereto a liquid adhesive having a different amount of the reaction accelerator from that of the above liquid adhesive, and pre-curing it under the same condition.

In case of forming the adhesive layer of three-layer structure, it is possible to use the following processes, that is, (1) a process which comprises preparing two or more B-stage cured adhesive sheets having each a different status of semi-cure, removing the release film from one of the B-stage cured adhesive sheet, and laminating on both sides of the resulted adhesive layer the other two adhesive sheets, (2) a process which comprises preparing a B-stage cured adhesive sheet having a suitable status of semi-cure by the above mentioned various processes, applying the same liquid adhesive or a liquid adhesive having the same composition except for the amount of the reaction accelerator to the above B-stage cured adhesive sheet, superposing a releasing film on the liquid adhesive layer and pre-curing it, and (3) a process which comprises bonding two uncured adhesive sheets to a B-stage cured adhesive sheet having a suitable degree, and pre-curing the laminate.

The adhesive tape for electronic parts of the present invention having the above construction can be adhered and cured at a relatively low temperature, and has sufficient heat resistance and reliability. Accordingly, it can suitably be used as an adhesive tape for the innerlead fix of a leadframe and a TAB tape, e.g., for adhering between parts constituting a semiconductor device, for example, lead pins, semiconductor-mounted substrates, heat spreaders, semiconductor chips themselves. Moreover, when the adhesive tape is used for the leadpins, good electric insulation is kept because the leadpins do not embed in the adhesive layer of the adhesive tape when curing treatment is carried out, and, consequently, semiconductor devices having good reliability can be obtained.

EXAMPLES

Example 1

30 parts by weight of a piperazinylethylamino-carbonyl-containing butadiene-acrylonitrile copolymer having weight average molecular weight: 70,000, acrylonitrile content: 25% by weight, and amino equivalent 4,000 (k=55, m=18, n=1), 70 parts by weight of a compound represented by the above mentioned formula (II-1), and 1 part of benzoyl peroxide were added to, mixed with and well dissolved in tetrahydrofuran to obtain a liquid adhesive having a solid content of 40% by weight. This liquid adhesive was coated to dry thickness of 20 μm on a surface of a polyethylene terephthalate film having thickness of 38 μm which was subjected to release treatment, followed by drying at 120° C. for 5 minutes in a hot-air circulating dryer to produce an uncured adhesive sheet.

Two of the above described uncured adhesive sheet were prepared, one of which was pre-cured at 100° C. for 12 hours in the hot-air circulating dryer to produce a B-stage cured adhesive sheet (a) having slipping velocity of 0.02 μm/sec. The other uncured adhesive sheet was pre-cured at 70° C. for 12 hours in the hot-air circulating dryer to produce a B-stage cured adhesive sheet (b) having slipping velocity of 0.30 μm/sec.

The resultant B-stage cured adhesive sheets (a) and (b) were superposed so as to oppose each adhesive layer of them, and they were bonded by passing through a pair of heating rolls heated to 140° C. at roll rate of 1 m/min to produce an adhesive tape having an adhesive layer composed of 2-layer structure.

Example 2

The same liquid adhesive as that of Example 1 was applied to a surface of the same release film as in Example 1 so as to form an adhesive layer having dry thickness of 20 μm, followed by drying at 180° C. for 5 minutes in a hot-air circulating dryer to produce a B-stage cured adhesive sheet (a) having slipping velocity of 0.05 μm/sec.

A B-stage cured adhesive sheet (b) having slipping velocity of 0.4 μm/sec was produced by the same manner as described above except that the drying by the hot-air circulating dryer was carried out at 160° C. for 5 minutes.

The resultant B-stage cured adhesive sheets (a) and (b) were superposed so as to face the adhesive layer of them each other, and they were bonded by passing through a pair of heating rolls heated to 140° C. at roll rate of 1 m/min to produce an adhesive tape having an adhesive layer of 2-layer structure.

Example 3

The same liquid adhesive as in Example 1 was applied to a surface of the same release film as in Example 1 so as to form an adhesive layer having dry thickness of 20 μm, and drying at 180° C. for 5 minutes in a hot-air circulating dryer to produce a B-stage cured adhesive sheet having slipping velocity of 0.05 μm/sec. To the surface of this B-stage cured adhesive sheet, the same liquid adhesive as in Example 1 was applied so as to give dry thickness of 20 μm, followed by drying at 160° C. for 5 minutes by a hot-air circulating dryer to produce a B-stage cured adhesive sheet having slipping velocity of 0.4 μm/sec, by which an adhesive tape having an adhesive layer of 2-layer structure was produced.

Example 4

30 parts by weight of a piperazinylethylamino-carbonyl-containing butadiene-acrylonitrile copolymer having weight average molecular weight: 70,000, acrylonitrile content: 25% by weight, and amino equivalent: 4,000 (k=55, m=18, n=1), 70 parts by weight of a compound represented by the above mentioned formula (II-1), 1 part of benzoyl peroxide and 2 parts by weight of lauroyl peroxide were added to, mixed with and well dissolved in tetrahydrofuran to obtain a liquid adhesive having a solid content of 40% by weight.

This liquid adhesive was coated to dry thickness of 2 0 μm on a surface of the same release film as that of Example 1, followed by drying at 140° C. for 5 minutes by a hot-air circulating dryer to produce a B-stage cured adhesive sheet (a) having slipping velocity of 0.01 μm/sec.

A liquid adhesive was produced by the same manner as described above except for using 0.05 parts by weight of lauroyl peroxide instead of 2 parts by weight thereof. Using this liquid adhesive, a B-stage cured adhesive sheet (b) having slipping velocity of 0.5 μm/sec was produced by the same manner as described above.

The resultant B-stage cured adhesive sheets (a) and (b) were superposed so as to oppose each adhesive layer of them, and they were then bonded by passing through a pair of heating rolls heated to 140° C. at roll rate of 1 m/min to produce an adhesive tape having an adhesive layer of 2-layer structure.

Example 5

On a B-stage cured adhesive sheet having slipping velocity of 0.01 μm/sec produced by the same manner as that of the B-stage cured adhesive sheet (a) in Example 4 was coated a liquid adhesive prepared by the same manner as in example 4 except that the amount of lauroyl peroxide was changed from 2 parts by weight to 0.05 parts by weight, followed by drying at 140° C. for 5 minutes in a hot-air circulating dryer to produce a B-stage cured adhesive sheet having slipping velocity of 0.5 μm/see, and thus an adhesive tape having an adhesive layer of 2-layer structure was produced.

Example 6

A B-stage cured adhesive sheet (a) having slipping velocity of 0.02 μm/sec and a B-stage cured adhesive sheet (b) having slipping velocity of 0.30 μm/sec were produced by the same manner as in Example 1.

After the release film was removed from the B-stage cured adhesive sheet (a), the B-stage cured adhesive sheets (b) were superposed on each side of the B-stage cured adhesive sheet (a), and they were bonded by passing through a pair of heating rolls heated to 140° C. at roll rate of 1 m/min to produce an adhesive tape having an adhesive layer of 3-layer structure.

Example 7

The same liquid adhesive as in Example 1 was applied to a surface of the same release film as in Example 1 so as to form an adhesive layer having dry thickness of 20 μm, and drying at 180° C. for 5 minutes in a hot-air circulating dryer to produce a B-stage cured adhesive sheet (a) having slipping velocity of 0.05 μm/sec.

A B-stage cured adhesive sheet (b) having slipping velocity of 0.4 μm/sec was produced by the same manner as described above except that the drying in the hot-air circulating dryer was carried out at 160° C. for 5 minutes.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 8

The same liquid adhesive as in Example 1 was coated on a surface of the same release film as in Example 1 so as to form an adhesive layer having dry thickness of 20 μm, followed by drying at 180° C. for 5 minutes in a hot-air circulating dryer to produce a B-stage cured adhesive sheet (a) having slipping velocity of 0.05 μm/sec.

After the release film was removed from the B-stage cured adhesive sheet (a), the same liquid adhesive as in Example 1 was applied to each side of the B-stage cured adhesive sheet (a) so as to give dry thickness of 20 μm. Then a polyethylene terephthalate film having thickness of 38 μm which was subjected to release treatment was superposed on the coated liquid adhesive layers respectively, followed by drying at 160° C. for 5 minutes to form B-stage adhesive layers having slipping velocity of 0.4 μm/sec, and thus an adhesive tape having an adhesive layer of 3-layer structure was produced.

Example 9

A B-stage cured adhesive sheet (a) having slipping velocity of 0.01 μm/sec and a B-stage cured adhesive sheet (b) having slipping velocity of 0.5 μm/sec were produced by the same manner as in Example 4. After the release film was removed from the B-stage cured adhesive sheet (a), the B-stage cured adhesive sheet (b) was superposed on each side of the B-stage cured adhesive sheet (a) and they were bonded by passing through a pair of heating rolls heated to 140° C. at roll rate of 1 m/min, whereby an adhesive tape having an adhesive layer of 3-layer structure was produced.

Example 10

The same liquid adhesive as in Example 4 was applied to a surface of a polyethylene terephthalate film having thickness of 38 μm which were subjected to release treatment to form an adhesive layer having dry thickness of 20 μm, followed by drying at 140° C. for 5 minutes to produce a B-stage adhesive sheet (a) having slipping velocity of 0.01 μm/sec.

After the release film was removed from the B-stage cured adhesive sheet (a), a liquid adhesive prepared by the same manner as described above except that the amount of lauroyl peroxide in Example 4 was changed from 2 parts by weight to 0.05 parts by weight was applied to each side of the B-stage cured adhesive sheet (a). Then the above described release films was superposed on the coated liquid adhesive layers respectively, followed by drying at 140° C. for 5 minutes to form B-stage adhesive layers having slipping velocity of 0.5 μm/sec, whereby an adhesive tape having an adhesive layer of 3-layer structure was produced.

Example 11

70 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=1.8$, $n=1$), 30 parts by weight of a compound represented by the above mentioned formula (II-1) and 1 part of benzoyl peroxide were added to, mixed with and well dissolved in tetrahydrofuran to obtain a liquid adhesive having a solid content of 40% by weight. This liquid adhesive was applied to a surface of a polyethylene terephthalate film having thickness of 38 μm which was subjected to release treatment so as to form an adhesive layer having dry thickness of 20 μm, and dryed at 120° C. for 5 minutes to produce an uncured adhesive sheet.

Two of the above uncured adhesive sheet were prepared, one of which was pre-cured at 100° C. for 12 hours in the hot-air circulating dryer to produce a B-stage cured adhesive sheet (a) having slipping velocity of 0.05 μm/sec. The other uncured adhesive sheet was pre-cured at 70° C. for 12 hours in the hot-air circulating dryer to produce a B-stage cured adhesive sheet (b) having slipping velocity of 0.35 μm/sec.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape having an adhesive layer of 2-layer structure.

Example 12

The same liquid adhesive as in Example 11 was applied to a surface of the same release film as in Example 11 so as to form an adhesive layer having dry thickness of 20 μm, followed by drying at 180° C. for 5 minutes in a hot-air circulating dryer to produce a B-stage cured adhesive sheet (a) having slipping velocity of 0.1 μm/sec.

A B-stage cured adhesive sheet (b) having slipping velocity of 0.6 μm/sec was produced by the same manner as described above except that the drying in the hot-air circulating dryer was carried out at 160° C. for 5 minutes.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape having an adhesive layer composed of 2-layer structure.

Example 13

The same liquid adhesive as in Example 11 was applied to a surface of the same release film as in Example 11 so as to form an adhesive layer having dry thickness of 20 μm, followed by drying at 180° C. for 5 minutes in a hot-air circulating dryer to produce a B-stage cured adhesive sheet having slipping velocity of 0.1 μm/sec.

On the resultant B-stage cured adhesive sheet, the same liquid adhesive as in Example 11 was coated so as to form an adhesive layer having dry thickness of 20 μm, followed by drying at 160° C. for 5 minutes to form a B-stage cured adhesive sheet having slipping velocity of 0.6 μm/sec, whereby an adhesive tape having 2-layer structure was produced.

Example 14

30 parts by weight of a piperazinylethylamino-carbonyl-containing butadiene-acrylonitrile copolymer having weight average molecular weight: 70,000, acrylonitrile content: 25% by weight and amino equivalent: 4,000 ($k=55$, $m=18$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46) and 1 part by weight of benzoyl peroxide were added to, mixed with and well dissolved in tetrahydrofuran to obtain a liquid adhesive having a solid content of 40% by weight.

This liquid adhesive was coated to give dry thickness of 20 μm on a surface of a 38 μm thick polyethylene terephthalate film which was subjected to release treatment, followed by drying at 120° C. for 5 minutes in a hot-air circulating dryer to produce an uncured adhesive sheet.

Two of the above mentioned uncured adhesive sheet were prepared, one of which was pre-cured at 100° C. for 12 hours in the hot-air circulating dryer to produce a B-stage cured adhesive sheet (a) having slipping velocity of 0.02 μm/sec.

The other uncured adhesive sheet was pre-cured at 70° C. for 12 hours in the hot-air circulating dryer to produce a B-stage cured adhesive sheet (b) having slipping velocity of 0.35 μm/sec.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape having an adhesive layer composed of 2-layer structure.

Example 15

The same liquid adhesive as that of Example 14 was coated to give dry thickness of 20 μm on a surface of a 38 μm thick polyethylene terephthalate film which was subjected to release treatment, followed by drying at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

The resultant B-stage cured adhesive sheets (a) and (b) were superposed so as to oppose each adhesive layer of them, followed by bonding them by passing through a pair of heating rolls heated to 140° C. at roll rate of 1 m/min, whereby an adhesive tape having an adhesive layer of 2-layer structure was produced.

Example 16

The same liquid adhesive as in Example 14 was coated on a surface of the same release film as in Example 14 so as to give dry thickness of 20 μm, followed by drying at 180° C. for 5 minutes in a hot-air circulating dryer to produce a B-stage cured adhesive sheet having slipping velocity of 0.04 μm/sec. On the surface of this B-stage cured adhesive sheet, the same liquid adhesive as in Example 14 was coated so as to give dry thickness of 20 μm, followed by drying at 160° C. for 5 minutes by a hot-air circulating dryer to produce a B-stage cured adhesive sheet having slipping velocity of 0.45 μm/sec, whereby an adhesive tape having an adhesive layer of 2-layer structure was produced.

Example 17

30 parts by weight of a piperazinylethylamino-carbonyl-containing butadiene-acrylonitrile copolymer having weight average molecular weight: 70,000, acrylonitrile content: 25% by weight and amino equivalent: 4,000 (k=55, m=18, n=1), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46), 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was coated on a surface of a 38 μm thick polyethylene terephthalate film which was subjected to release treatment so as to form an adhesive layer having dry thickness of 20 μm, followed by drying at 140° C. for 5 minutes in a hot-air circulating dryer to produce a B-stage cured adhesive sheet (a) having slipping velocity of 0.02 μm/sec.

A liquid adhesive was produced by the same manner as described above except for using 0.05 parts by weight of lauroyl peroxide instead of 2 parts by weight thereof. Using this liquid adhesive, a B-stage cured adhesive sheet (b) having slipping velocity of 0.55 μm/sec was produced by the same manner as described above.

The resultant B-stage cured adhesive sheets (a) and (b) were superposed so as to oppose each adhesive layer of them, followed by bonding them by passing through a pair of heating rolls heated to 140° C. at roll rate of 1 m/min, whereby an adhesive tape having an adhesive layer of 2-layer structure was produced.

Example 18

On a B-stage cured adhesive sheet (a) having slipping velocity of 0.02 μm/sec produced in Example 17 was coated a liquid adhesive prepared by the same manner as in example 17 except that the amount of lauroyl peroxide was changed from 2 parts by weight to 0.05 parts by weight, followed by drying at 140° C. for 5 minutes in a hot-air circulating dryer to produce a B-stage cured adhesive sheet having slipping velocity of 0.55 μm/sec, whereby an adhesive tape having an adhesive layer of 2-layer structure was produced.

Example 19

A B-stage cured adhesive sheet (a) having slipping velocity of 0.02 μm/sec and a B-stage cured adhesive sheet (b) having slipping velocity of 0.35 μm/sec were produced by the same manner as in Example 14.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 20

The same liquid adhesive as in Example 14 was applied to a surface of the same release film as in Example 14 so as to give dry thickness of 20 μm, followed by drying at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 21

The same liquid adhesive as in Example 14 was coated on a surface of the same 38 μm thick release film as in Example 14 so as to give dry thickness of 20 μm, followed by drying at 180° C. for 5 minutes in a hot-air circulating dryer to produce a B-stage cured adhesive sheet having slipping velocity of 0.04 μm/sec. After the release film was removed from of the B-stage cured adhesive sheet, the same liquid adhesive as in Example 14 was applied to each side of the B-stage cured adhesive sheet so as to give dry thickness of 20 μm. Then a 38 μm thick polyethylene terephthalate film which was subjected to release treatment was superposed on the coated liquid adhesive layers respectively, followed by drying at 160° C. for 5 minutes to form B-stage adhesive layers having slipping velocity of 0.45 μm/sec, whereby an adhesive tape having an adhesive layer of 3-layer structure was produced.

Example 22

A B-stage cured adhesive sheet (a) having sliding rate of 0.02 μm/sec and a B-stage cured adhesive sheets (b) having slipping velocity of 0.55 μm/sec were produced by the same manner as in Example 17.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 23

The release film was removed from the B-stage cured adhesive sheet having slipping velocity of 0.02 μm/sec produced by the same manner as in Example 17. Then a liquid adhesive obtained by the same manner as in Example 17 except that the amount of lauroyl peroxide was changed from 2 parts by weight to 0.02 parts by weight was applied to each side of the above B-stage cured adhesive sheet so as to give dry thickness of 20 μm. Thereafter a 38 μm thick polyethylene terephthalate film which was subjected to release treatment was superposed on the both coated liquid adhesive layers respectively, followed by drying at 140° C. for 5 minutes to form B-stage adhesive layers having slipping velocity of 0.55 μm/sec, whereby an adhesive tape having an adhesive layer of 3-layer structure was produced.

Example 24

50 parts by weight of a piperazinylethylamino-carbonyl-containing butadiene-acrylonitrile copolymer having a weight average molecular weight: 70,000, acrylonitrile content: 25% by weight and amino equivalent: 4,000 (k=55, m=18, n=1), 47 parts by weight of a compound represented by the above mentioned formula (II-1), 3 parts by weight of 1,3-bis(3-aminopropyl)-1,1,3,3-tetramethyldisiloxane (molar equivalent of maleimide group of the above mentioned compound per molar equivalent of amino group: 1.46), 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was applied to a surface of a 38 μm thick polyethylene terephthalate film which was subjected to release treatment so as to give dry thickness of 20 μm, followed by drying at 140° C. for 5 minutes in a hot-air circulating dryer to produce a B-stage cured adhesive sheet (a) having slipping velocity of 0.05 μm/sec.

A liquid adhesive was produced by the same manner as described above except for using 0.05 parts by weight of lauroyl peroxide instead of 2 parts by weight thereof. Using this liquid adhesive, a B-stage cured adhesive sheet (b) having slipping velocity of 1.0 μm/sec was produced by the same manner as described above.

The resultant B-stage cured adhesive sheets (a) and (b) were superposed so as to oppose each adhesive layer of the, followed by bonding them by passing through a pair of heating rolls heated to 140° C. at roll rate of 1 m/min to produce an adhesive tape having an adhesive layer of 2-layer structure.

Example 25

On the B-stage cured adhesive sheet (a) having slipping velocity of 0.05 μm/sec produced in Example 24 was coated respectively a liquid adhesive prepared by the same manner as in Example 24 except for using 0.05 parts by weight of lauroyl peroxide instead of 2 parts by weight thereof, followed by drying at 140° C. for 5 minutes in the hot-air circulating dryer to form a B-stage cured adhesive sheet having slipping velocity of 0.9 μm/sec, whereby an adhesive tape having an adhesive layer composed of 2-layer structure was produced.

Example 26

The same liquid adhesive as in Example 24 was applied to a surface of a 38 μm thick polyethylene terephthalate film which was subjected to release treatment so as to give dry thickness of 20 μm, followed by drying at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.02 μm/sec.

The other uncured adhesive sheet was pre-cured at 70° C. for 12 hours in a hot-air circulating dryer to produce a B-stage cured adhesive sheet (b) having slipping velocity of 0.35 μm/sec.

The resultant B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 27

30 parts by weight of a piperazinylethyl-aminocarbonyl-containing butadiene-acrylonitrile copolymer having a weight average molecular weight: 70,000, an acrylonitrile content: 25% by weight and amino equivalent: 4,000 (k=55, m=18, n=1), 68 parts by weight of a compound represented by the above mentioned formula (II-1), 2 parts by weight of hexamethylenediamine (molar equivalent of maleimide group of the above mentioned compound per molar equivalent of amino group: 3.00), 1 part by weight of benzoyl peroxide and 2 parts by weight of lauroyl peroxide were added to, mixed with and well dissolved in tetrahydrofuran to obtain a liquid adhesive having a solid content of 40% by weight.

This liquid adhesive was applied to a surface of a 38 μm thick polyethylene terephthalate film which was subjected to release treatment so as to give dry thickness of 20 μm, followed by drying at 140° C. for 5 minutes to produce a B-stage cured adhesive sheet having slipping velocity of 0.15 μm/sec.

After the release film was removed from the resultant B-stage cured adhesive sheet, a liquid adhesive obtained by the same manner as described above except that the amount of lauroyl peroxide was changed from 2 parts by weight to 0.02 parts by weight was applied to each side of the B-stage cured adhesive sheet so as to give dry thickness of 20 μm. Then a 38 μm thick polyethylene terephthalate film which was subjected to release treatment was superposed on the both coated liquid adhesive layers respectively, followed by drying at 140° C. for 5 minutes to form B-stage adhesive layers having slipping velocity of 2.00 μm/sec, whereby an adhesive tape having an adhesive layer of 3-layer structure was produced.

Example 28

30 parts by weight of a piperazinylethyl-aminocarbonyl-containing butadiene-acrylonitrile copolymer having a weight average molecular weight: 70,000, an acrylonitrile content: 25% by weight and amino equivalent: 4,000 (k=55, m=18, n=1), 68 parts by weight of a compound represented by the above mentioned formula (II-1), 2 parts by weight of hexamethylenediamine (molar equivalent of maleimide group of the above mentioned compound per molar equivalent of amino group: 3.00) and 1 part by weight of benzoyl peroxide were added to, mixed with and well dissolved in tetrahydrofuran to obtain a liquid adhesive having a solid content of 40% by weight. This liquid adhesive was coated on a surface of a 38 μm thick polyethylene terephthalate film which was subjected to release treatment so as to give dry thickness of 20 μm, followed by drying at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.1 μm/sec.

The other uncured adhesive sheet was pre-cured at 70° C. for 12 hours in a hot-air circulating dryer to produce a B-stage cured adhesive sheet (b) having slipping velocity of 1.5 μm/sec.

The resultant B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 29

30 parts by weight of a piperazinylethylamino-carbonyl-containing butadiene-acrylonitrile copolymer having a weight average molecular weight of 70,000, an acrylonitrile content of 25% by weight, and an amino equivalent of 4,000 ($k=55$, $m=18$, $n=1$), 68 parts by weight of a compound represented by the above mentioned formula (II-1), 2 parts by weight of hexamethylenediamine (molar equivalent of maleimide group of the above mentioned compound per molar equivalent of amino group: 3.00) and 1 part by weight of benzoyl peroxide were added to, mixed with and well dissolved in tetrahydrofuran to obtain a liquid adhesive having a solid content of 40% by weight. This liquid adhesive was coated on a surface of a 38 μm thick polyethylene terephthalate film which was subjected to release treatment so as to give dry thickness of 20 μm, followed by drying at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.2 μm/sec.

The other uncured adhesive sheet was pre-cured at 70° C. for 12 hours in a hot-air circulating dryer to produce a B-stage cured adhesive sheet (b) having slipping velocity of 2.35 μm/sec.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 30

30 parts by weight of a piperazinylethylamino-carbonyl-containing butadiene-acrylonitrile copolymer having a weight average molecular weight: 70,000, acrylonitrile content: 25% by weight and amino equivalent: 4,000 ($k=55$, $m=18$, $n=1$), 61 parts by weight of a compound represented by the above mentioned formula (II-2), 9 parts by weight of 1,3-bis(3-aminopropyl)-1,1,3,3-tetramethyldisiloxane (molar equivalent of maleimide group of the above mentioned compound per molar equivalent of amino group: 2.33) and 1 part by weight of benzoyl peroxide were added to, mixed with and well dissolved in tetrahydrofuran to obtain a liquid adhesive having a solid content of 40% by weight.

This liquid adhesive was coated to give dry thickness of 20 μm on a surface of a 38 μm thick polyethylene terephthalate film which was subjected to release treatment, followed by drying at 180° C. for 5 minutes in a hot-air circulating dryer to produce a B-stage cured adhesive sheet (a) having slipping velocity of 0.01 μm/sec.

A B-stage cured adhesive sheet (b) having slipping velocity of 0.20 μm/sec was produced by the same manner as described above except that the drying in the hot-air circulating dryer was carried out at 160° C. for 5 minutes.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 31

The release film was removed from the B-stage cured adhesive sheet having slipping velocity of 0.01 μm/sec produced by the same manner as the B-stage cured adhesive sheet (a) in Example 30. Then, the same liquid adhesive as that in Example 30 was applied to each side of the above B-stage cured adhesive sheet so as to give dry thickness of 20 μm. After a 38 μm thick polyethylene terephthalate film which was subjected to release treatment was superposed on the coated liquid adhesive layers respectively, the laminate was dried at 160° C. for 5 minutes in a hot-air circulating dryer to form B-stage cured adhesive layers having slipping velocity of 0.25 μm/sec, whereby an adhesive tape having an adhesive layer of 3-layer structure was produced.

Example 32

30 parts by weight of a piperazinylethylamino-carbonyl-containing butadiene-acrylonitrile copolymer having a weight average molecular weight: 70,000, acrylonitrile content: 25% by weight and amino equivalent: 4,000 ($k=55$, $m=18$, $n=1$), 61 parts by weight of a compound represented by the above mentioned formula (II-2), 9 parts by weight of 1,3-bis(3-aminopropyl)-1,1,3,3-tetramethyldisiloxane (molar equivalent of maleimide group of the above mentioned compound per molar equivalent of amino group: 2.33), 1 part by weight of benzoyl peroxide and 2 parts by weight of lauroyl peroxide were added to, mixed with and well dissolved in tetrahydrofuran to obtain a liquid adhesive having a solid content of 40% by weight. This liquid adhesive was coated on a surface of a 38 μm thick polyethylene terephthalate film which was subjected to release treatment so as to give dry thickness of 20 μm, followed by drying at 140° C. for 5 minutes to produce a B-stage cured adhesive sheet (a) having slipping velocity of 0.01 μm/sec.

A B-stage cured adhesive sheet (b) having slipping velocity of 0.20 μm/sec was produced by the same manner as described above except that the amount of lauroyl peroxide was changed from 2 parts by weight to 0.01 parts by weight.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 33

30 parts by weight of a piperazinylethylamino-carbonyl-containing butadiene-acrylonitrile copolymer having a weight average molecular weight: 70,000, acrylonitrile content: 25% by weight and amino equivalent: 4,000 ($k=55$, $m=18$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46) and 1 part by weight of benzoyl peroxide were added to, mixed with and well dissolved in tetrahydrofuran to obtain a liquid mixture having a solid content of 40% by weight. To the resultant liquid mixture, 10 parts by weight of alumina filler (particle size: 0.05 μm, produced by Showa Denko K.K.) were added to produce a liquid adhesive. This liquid adhesive was coated on a surface of a 38 μm thick polyethylene terephthalate film which was subjected to release treatment so as to give dry thickness of 20 μm, followed by drying at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.02 μm/sec.

The other uncured adhesive sheet was pre-cured at 70° C. for 12 hours in a hot-air circulating dryer to produce a B-stage cured adhesive sheet (b) having slipping velocity of 0.35 μm/sec.

The above mentioned the B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 34

The same liquid adhesive as in Example 33 was coated on a surface of the same release film as in Example 33 so as to form an adhesive layer having dry thickness of 20 μm, followed by drying at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in a hot-air circulating dryer was carried out at 160° C. for 5 minutes.

The above mentioned the B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 35

The same liquid adhesive as in Example 33 was coated on a surface of the same release film as in Example 33 so as to form an adhesive layer having dry thickness of 20 μm, followed by drying at 180° C. for 5 minutes in a hot-air circulating dryer to produce a B-stage cured adhesive sheet having slipping velocity of 0.04 μm/sec. On this B-stage cured adhesive sheet was coated the same liquid adhesive as in Example 33, followed by drying at 160° C. for 5 minutes in a hot-air circulating dryer to form a B-stage adhesive layer having slipping velocity of 0.45 μm/sec, whereby an adhesive tape having an adhesive layer of 2-layer structure was produced.

Example 36

30 parts by weight of a piperazinylethylamino-carbonyl-containing butadiene-acrylonitrile copolymer having a weight average molecular weight: 70,000, acrylonitrile content: 25% by weight and amino equivalent: 4,000 (k=55, m=18, n=1), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46), 1 part by weight of benzoyl peroxide and 2 parts by weight of lauroyl peroxide were added to, mixed with and well dissolved in tetrahydrofuran to obtain a liquid mixture having a solid content of 40% by weight. To the resultant liquid mixture, 10 parts by weight of alumina filler (particle size: 0.05 μm, produced by Showa Denko K.K.) were added to produce a liquid adhesive. This liquid adhesive was coated on a surface of a 38 μm thick polyethylene terephthalate film which was subjected to release treatment so as to give dry thickness of 20 μm, followed by drying at 140° C. for 5 minutes to produce a B-stage cured adhesive sheet (a) having slipping velocity of 0.02 μm/sec.

A B-stage cured adhesive sheet (b) having slipping velocity of 0.55 μm/sec was produced by the same manner as described above except that the amount of lauroyl peroxide was changed from 2 parts by weight to 0.05 parts by weight.

The above mentioned B-stage cured adhesive sheets (a) and (b) were superposed so as to oppose each adhesive layer of them, and they were bonded by passing through a pair of heating rolls heated to 140° C. at roll rate of 1 m/min to produce an adhesive tape having an adhesive layer composed of 2-layer structure.

Example 37

On a B-stage cured adhesive sheet having slipping velocity of 0.02 μm/sec produced by the same manner as the B-stage adhesive sheet (a) in Example 36 was coated a liquid adhesive prepared by the same manner as in Example 36 except that the amount of lauroyl peroxide was changed from 2 parts by weight to 0.05 parts by weight, followed by drying at 140° C. for 5 minutes by a hot-air circulating dryer to produce a B-stage cured adhesive sheet having slipping velocity of 0.55 μm/sec, whereby an adhesive tape having an adhesive layer of 2-layer structure was produced.

Example 38

A B-stage cured adhesive sheet (a) having slipping velocity of 0.02 μm/sec and a B-stage cured adhesive sheet (b) having slipping velocity of 0.35 μm/sec were produced by the same manner as in Example 33.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 39

The same liquid adhesive as in Example 33 was coated on a surface of the same release film as in Example 33 so as to give dry thickness of 20 μm, followed by drying at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 40

The same liquid adhesive as in Example 33 was applied to a surface of the same release film as in Example 33 so as to give dry thickness of 20 μm, followed by drying at 180° C. for 5 minutes in a hot-air circulating dryer to produce a B-stage cured adhesive sheet having slipping velocity of 0.04 μm/sec. After the release film was removed from the resultant B-stage cured adhesive sheet, the same liquid adhesive as in Example 33 was applied to each side of the B-stage cured adhesive sheet so as to give dry thickness of 20 μm. After a 38 μm thick polyethylene terephthalate film which was subjected to release treatment was superposed on the coated liquid adhesive layers respectively, the laminate was dryed at 160° C. for 5 minutes to form B-stage adhesive layers having slipping velocity of 0.45 μm/sec, whereby an adhesive tape having an adhesive layer of 3-layer structure was produced.

Example 41

A B-stage cured adhesive sheet (a) having slipping velocity of 0.02 μm/sec and a B-stage cured adhesive sheets (b) having slipping velocity of 0.55 μm/sec were produced by the same manner as in Example 36.

After the release film was removed from the B-stage cured adhesive sheet (a), the B-stage cured adhesive sheet (b) was superposed on each side of the B-stage cured adhesive sheet (a), followed by bonding them by passing through a pair of heating rolls heated to 140° C. at roll rate of 1 m/min to produce an adhesive tape having an adhesive layer of 3-layer structure.

Example 42

The release film was removed from the B-stage cured adhesive sheet having slipping velocity of 0.02 μm/sec produced by the same manner as the B-stage cured adhesive sheet (a) in Example 36, a liquid adhesive obtained by the same manner as in Example 36 except that the amount of lauroyl peroxide was changed from 2 parts by weight to 0.02 parts by weight was applied to each side of the above B-stage cured adhesive sheet so as to give dry thickness of 20 μm. Then a 38 μm thick polyethylene terephthalate film which was subjected to release treatment was superposed on the both coated liquid adhesive layers respectively, followed by drying at 140° C. for 5 minutes to form B-stage adhesive layers having slipping velocity of 0.55 μm/sec, whereby an adhesive tape having an adhesive layer of 3-layer structure was produced.

Example 43

30 parts by weight of a piperazinylethylamino-carbonyl-containing butadiene-acrylonitrile copolymer having weight average molecular weight: 20,000, acrylonitrile content: 20% by weight and amino equivalent: 4,000 ($k=58.4$, $m=14.6$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group: 1.46) and 1 part by weight of benzoyl peroxide were added to, mixed with and well dissolved in tetrahydrofuran to obtain a liquid adhesive having a solid content of 40% by weight. This liquid adhesive was applied to a surface of a 38 μm thick polyethylene terephthalate film which was subjected to release treatment so as to give dry thickness of 20 μm, followed by drying at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.02 μm/sec.

The other uncured adhesive sheet was pre-cured at 70° C. for 12 hours in a hot-air circulating dryer to produce a B-stage cured adhesive sheet (b) having slipping velocity of 0.35 μm/sec.

The resultant B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 44

The same liquid adhesive as in Example 43 was coated on a surface of the same release film as in Example 43 so as to give dry thickness of 20 μm, followed by drying at 180° C. for 5 minutes in a hot-air circulating dryer to produce a B-stage cured adhesive sheet having slipping velocity of 0.04 μm/sec.

A B-stage cured adhesive sheet (b) having slipping velocity of 0.45 μm/sec was produced by the same manner as described above except that the drying in the hot-air circulating dryer was carried out at 160° C. for 5 minutes.

The resultant B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 45

On a B-stage cured adhesive sheet having slipping velocity of 0.04 μm/sec produced by the same manner as the B-stage adhesive sheet (a) in Example 43 was coated the same liquid adhesive as in Example 43 so as to give dry thickness of 20 μm, followed by drying at 160° C. for 5 minutes in a hot-air circulating dryer to form a B-stage cured adhesive sheet having slipping velocity of 0.45 μm/sec, whereby an adhesive tape having an adhesive layer of 2-layer structure was produced.

Example 46

30 parts by weight of a piperazinylethylamino-carbonyl-containing butadiene-acrylonitrile copolymer having a weight average molecular weight: 150,000, acrylonitrile content: 20% by weight and amino equivalent: 4,000 ($k=58/4$, $m=14.6$, $n=1$), 61 parts by weight of a compound represented by the above mentioned formula (II-1), 9 parts by weight of 1,3-bis(3-aminopropyl)-1,1,3,3-tetramethyldisiloxane (molar equivalent of maleimide group of the above mentioned compound per molar equivalent of amino group:

1.46) and 1 part by weight of benzoyl peroxide were added to, mixed with and well dissolved in tetrahydrofuran to obtain a liquid adhesive having a solid content of 40% by weight. This liquid adhesive was coated on a surface of a 38 μm thick polyethylene terephthalate film which was subjected to release treatment so as to give dry thickness of 20 μm, followed by drying in the hot-air circulating dryer at 120° C. for 5 minutes to produce an uncured adhesive sheet.

Two of the uncured adhesive sheet were prepared, one of which was pre-cured at 100° C. for 12 hours in a hot-air circulating dryer to produce a B-stage cured adhesive sheet (a) having slipping velocity of 0.02 μm/sec.

The other uncured adhesive was pre-cured at 70° C. for 12 hours in a hot-air circulating dryer to produce a B-stage cured adhesive sheet (b) having slipping velocity of 0.35 μm/sec.

The resultant B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 47

The same liquid adhesive as in Example 46 was coated on a surface of the same release film as in Example 46 so as to give dry thickness of 20 μm, followed by drying at 180° C. for 5 minutes in a hot-air circulating dryer to produce a B-stage cured adhesive sheet (a) having slipping velocity of 0.04 μm/sec.

A B-stage cured adhesive sheet (b) having slipping velocity of 0.45 μm/sec was produced by the same manner as described above except that the drying in a hot-air circulating dryer was carried out at 160° C. for 5 minutes.

The above mentioned the B-stage cured adhesive sheets (a) and (b) were superposed so as to oppose each adhesive layer of them, followed by bonding them by passing through a pair of heating rolls heated to 140° C. at roll rate of 1 m/min to produce an adhesive tape having an adhesive layer of 2-layer structure.

Example 48

On a B-stage cured adhesive sheet having slipping velocity of 0.04 μm/sec obtained by the same manner as the B-stage cured adhesive sheet (a) in Example 46 was coated the same liquid adhesive as in Example 46 so as to give dry thickness of 20 μm, followed by drying at 160° C. for 5 minutes to form a B-stage cured adhesive layer having slipping velocity of 0.45 μm/sec, whereby an adhesive tape having an adhesive layer of 2-layer structure was produced.

Comparative Example 1

A nylon-epoxy adhesive (TORESINE FS-410, produced by Teikoku Kagaku Sangyo K.K.) (solid content: 20%; solvent isopropyl alcohol:methyl ethyl ketone=2:1) was prepared.

The resultant adhesive was coated on a surface of a 38 μm thick polyethylene terephthalate film which was subjected to release treatment to give dry thickness of 40 μm, followed by drying in a hot-air circulating dryer at 150° C. for 15 minutes to produce an adhesive sheet having a B-stage cured adhesive layer.

Comparative Example 2

A 20% by weight solution of polyimide varnish (Lark TPI, produced by MITUI TOATSU CHEMICALS INC.) in N-methylpyrrolidone was prepared.

This adhesive was coated on a surface of a 38 μm thick polyethylene terephthalate film which was subjected to release treatment to give dry thickness of 40 μm, followed by drying at 150° C. for 120 minutes and then at 250° C. for 60 minutes in a hot-air circulating dryer to produce an adhesive sheet having a B-stage cured adhesive layer.

Comparative Example 3

The liquid adhesive in Example 1 was coated on a surface of a 38 μm thick polyethylene terephthalate film which was subjected to release treatment to give dry thickness of 40 μm, followed by drying at 120° C. for 5 minutes in a hot-air circulating dryer and then pre-curing at 100° C. for 12 hours in the hot-air circulating dryer, to produce an adhesive sheet having a B-stage cured adhesive layer having slipping velocity of 0.02 μm/sec which was composed of only one semi-cured layer having a high status of semi-cure.

Comparative Example 4

The liquid adhesive in Example 1 was coated on a surface of a 38 μm thick polyethylene terephthalate film which was subjected to release treatment to give dry thickness of 40 μm, followed by drying at 120° C. for 5 minutes in a hot-air circulating dryer and then pre-curing at 70° C. for 12 hours in the hot-air circulating dryer, to produce an adhesive sheet having a B-stage cured adhesive layer having slipping velocity of 0.3 μm/sec which was composed of only one semi-cured layer having a low status of semi-cure.

(Assembling of Leadframe)

The leadframe used in a semiconductor package as shown in FIG. 1was assembled according to the following procedures.

(a) Punch Die of Adhesive Tape

The adhesive tape was subjected to punch dying by mold.

(b) Pre-attachment of Adhesive Tape

A metal plane was placed on a hot plate, and the tape punched out in a ring form was pressed onto the plane by means of a metal rod to be pre-attached.

(c) Assembling of Leadframe

The metal plane to which the adhesive tape had been pre-attached in the above stage and a leadframe were positioned, and heated and pressed on a hot plate heated at 120° C. to adhere the leadframe and the plane via the adhesive tape.

(d) Curing of Adhesive Tape

In a hot-air circulating oven whose atmosphere was substituted by nitrogen, the adhesive tape was cured on the leadframe assembled in the above three stages under the conditions described in Table 1.

TABLE 1

| | Name of operation | | |
|---|---|---|---|
| Adhesive tape | Pre-attachment of Adhesive Tape | Assembling of Leadframe | Curing of Adhesive Tape |
| Adhesive Tapes of Examples 1–48 | 100° C./2 sec./ 4 kg/cm² | 120° C./2 sec./ 4 kg/cm² | 250° .C/90 sec. |
| Adhesive Tape of | 80° C./2 sec./ | 120° C./2 sec./ | 150° C./3 |

TABLE 1-continued

| Adhesive tape | Pre-attachment of Adhesive Tape | Assembling of Leadframe | Curing of Adhesive Tape |
|---|---|---|---|
| Comparative Example 1 | 4 kg/cm² | 4 kg/cm² | hrs. |
| Adhesive Tape of Comparative Example 2 | 350° C./10 sec./ 4 kg/cm² | 350° C./15 sec./ 20 kg/cm² | None |
| Adhesive Tape of Comparative Example 3 | 100° C./2 sec./ 4 kg/cm² | 120° C./2 sec./ 4 kg/cm² | 250° C./90 sec. |
| Adhesive Tape of Comparative Example 4 | 100° C./2 sec./ 4 kg/cm² | 120° C./2 sec./ 4 kg/cm² | 250° C./90 sec. |

(Assembling of Semiconductor Package)

Thereafter, the produced leadframe was used to assemble a package according to the following procedures. The reason why the conditions of curing were different at the time of assembling the package is that the characteristics of the adhesives are different from each other. Here, optimum conditions for each adhesive were selected, and the adhesive was cured based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished. (The Results of Evaluations of Adhesive Tapes and Semiconductor Packages)

(a) Temperature range of Taping

The evaluation of whether or not the adhesive tape could be easily and rapidly adhered to the substance to be adhered, i.e., the plane or lead pins was carried out. Specifically, the temperature range where each adhesive tape could be adhered by means of a taping machine was determined.

It was found that the adhesive tapes of the present invention and the adhesive tapes of Comparative Example 1 and 4 could be adhered at a temperature range of from 100° to 180° C., but that of Comparative Example 4 required a temperature of not less than 400° C. and that of Comparative Example 3 required a temperature of not less than 250° C.

(b) Oxidization of Leadframe

The evaluation of whether or not the oxidization took place during curing the adhesive was visually determined by observing the color change on the surface of the leadframe.

As a result, since the adhesive tapes of the present invention could be taped at a low temperature, no oxidation occurred, but in the case of the adhesive tapes of Comparative Example 2 and 3 requiring a high adhesion temperature, the color change was observed, indicating that the leadframe was oxidized.

(c) Adhesion Strength

A 90° peel strength of 10 mm wide tape at room temperature was measured after the adhesive tape was adhered (taped) onto a copper plate at 140° C.

As a result, the adhesive tapes of the present invention and the adhesive tape of Comparative Example 4 were found to have a strength ranging from 25–40 g/10 mm, while the adhesive tape of Comparative Example 1 had the strength of 2–4 g/10 mm, and those of Comparative Example 2 and 3 had the strength of 10–40 g/10 mm, the last value having a large variation.

(d) Void

Whether or not the voids formed when the adhesive was cured was within the level problematic for a practical use was visually evaluated by means of a microscope.

As a result, in the adhesive tapes of the present invention, no void could be found, whereas in the adhesive tapes of Comparative Example 1, the formation of voids was found.

(e) Processability

Handlings (curl, feedability, etc.) when the adhesive tapes were used in order to assemble leadframes, and the surface tackiness of the adhesive tapes were evaluated.

As a result, the adhesive tapes of the present invention was found to have good handling abilities, and that no tacking occurred on the surfaces, but the adhesive of Comparative Example 2 was found to be problematic in handling abilities.

(f) Wire Bondability

In the assembling of the package, the wire bondability onto the leadframe when wire bonding with the gold wire was determined.

As a result, in the case of using the adhesive tapes of the present invention, no bonding defect was observed in the tests for 832 pins. On the other hand, in the case of Comparative Example 1, bonding defects were observed in 125 of the 832 pins, indicating that the gold wire bonding could not be done with sufficient strength.

(g) Evaluation of Semiconductor Packages

The packages obtained as described above were tested using the PCBT Test (Pressure Cooker Biased Test). The test was carried out at 5 V of applied voltage at 121° C., at 2 atmospheres and at 100% relative humidity. As a result, in the case of the present invention, no shorting took place even after 1,000 hours. In the case of Comparative Example 4, electric insulation was not kept in 15 samples of 50 samples to be tested when measured by electric conduction test before carrying out the PCBT test.

As is clear from the results described above, in the case of the adhesive tapes for electronic parts of the present invention, the semiconductor package can be produced in a good manner. In contrast, the adhesive tapes of Comparative Examples 1–4 are not suitable for manufacturing electronic parts, because there are problems in that oxidation of leadframe occurs, the conditions for adhering are not suitable for assembling a leadframe, the wire bonding of gold wire cannot be carried out, and electric insulation between the leadframe and the substance to be adhered such as a metal heat spreader, etc. is not kept.

What is claimed is:

1. An adhesive tape for electronic parts which comprises an adhesive layer provided on a surface of a release film, said adhesive layer being semi-cured into a B-stage and composed of:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

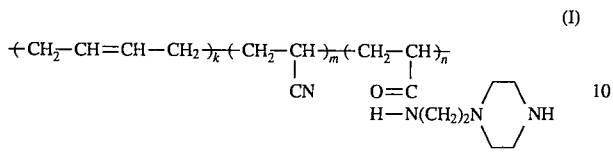

(I)

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

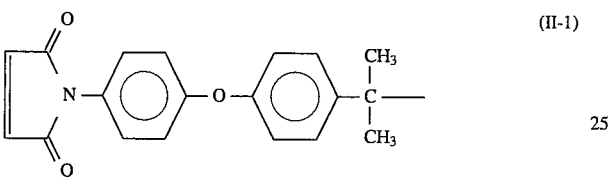

(II-1)

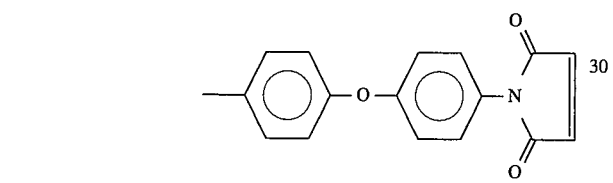

(II-2)

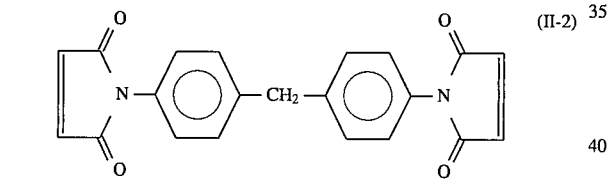

(II-3)

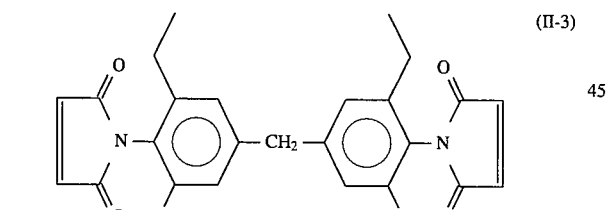

(II-4)

wherein p is an integer of from 0 to 7,

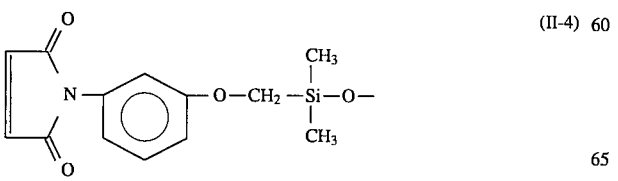

(II-4)

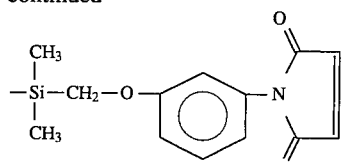

(II-6)

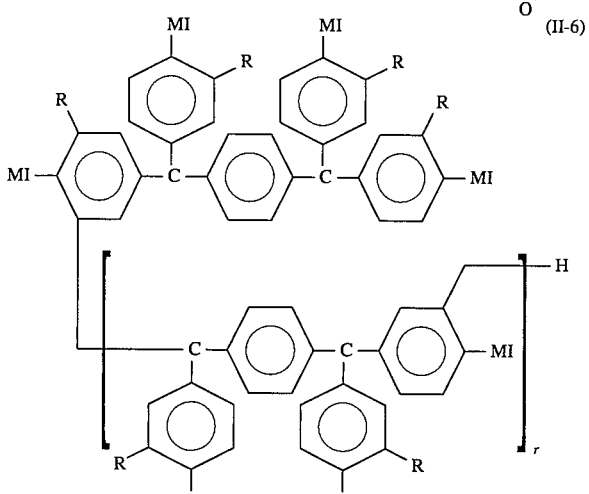

wherein MI=maleimide group, R=H or $CH_3$ and r=1–5, the ratio of component (b) based on 100 parts by weight of component (a) being in a range of 10 to 900 parts by weight, and said adhesive layer being composed of at least two semi-cured layers having each a different status of semi-cure.

2. The adhesive tape for electronic parts as claimed in claim 1, wherein a release film is laminated on a surface of the adhesive layer.

3. The adhesive tape for electronic parts as claimed in claim 1, wherein 4 to 40% by weight of a filler having a particle size of not more than 1 μm is contained in the adhesive layer.

4. The adhesive tape for electronic parts as claimed in claim 1, wherein said adhesive layer cured into the B-stage is a laminate consisting of a semi-cured layer having a higher status of semi-cure in a range of 0.01–0.3 μm/sec of the slipping velocity and a semi-cured layer having a lower status of semi-cure in a range of 0.1–10.0 μm/sec of the slipping velocity, wherein the slipping velocity ($V_1$) of the semi-cured layer having a higher status of semi-cure and the slipping velocity ($V_2$) of the semi-cured layer having a lower status of semi-cure has the relation of $V_2>V_1$.

5. The adhesive tape for electronic parts as claimed in claim 1, wherein said adhesive layer cured into the B-stage is a laminate consisting of the first semi-cured layer having a lower status of semi-cure in a range of 0.1–10.0 μm/sec of the slipping velocity, a semi-cured layer having a higher status of semi-cure in 0.3 μm/sec or less of the slipping velocity and the second semi-cured layer having a lower status of semi-cure in a range of 0.1– 10.0 μm/sec of the slipping velocity, wherein the slipping velocity ($V_3$) of the semi-cured layer having a higher status of semi-cure, the slipping velocity ($V_4$) of the first semi-cured layer having a lower status of semi-cure and the slipping velocity ($V_5$) of the second semi-cured layer having a lower status of semi-cure have the relations of $V_4>V_3$ and $V_5>V_3$.

6. An adhesive tape for electronic parts which comprises an adhesive layer provided on a surface of a release film, said adhesive layer being semi-cured into B-stage and composed of:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

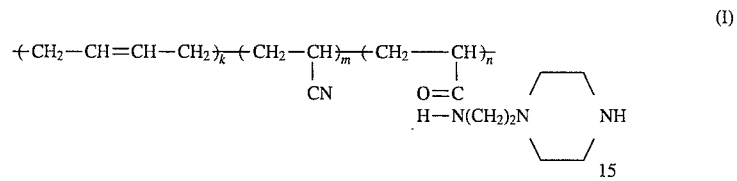

(I)

wherein, k, m, and n are molar ratios and taking n as 1, k is a number of 3–175, and m is a number of 0.3 to 93;

(b) a compound having at least two maleimide groups selected from the compounds represented by the following formulae (II-1) to (II-6):

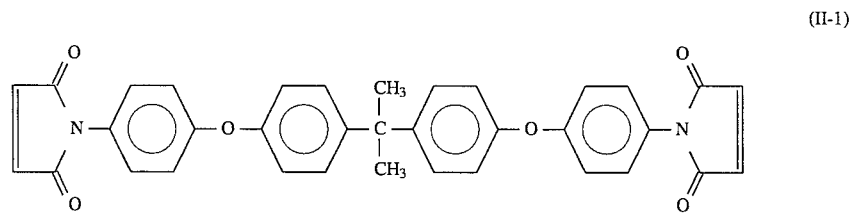

(II-1)

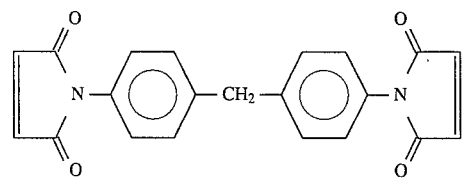

(II-2)

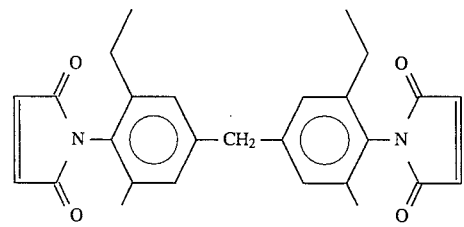

(II-3)

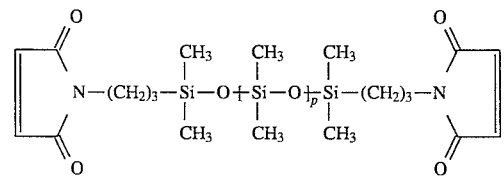

(II-4)

wherein p is an integer of from 0 to 7,

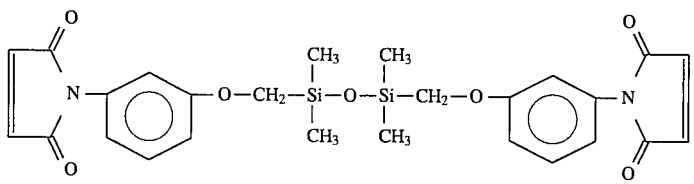 (II-5)

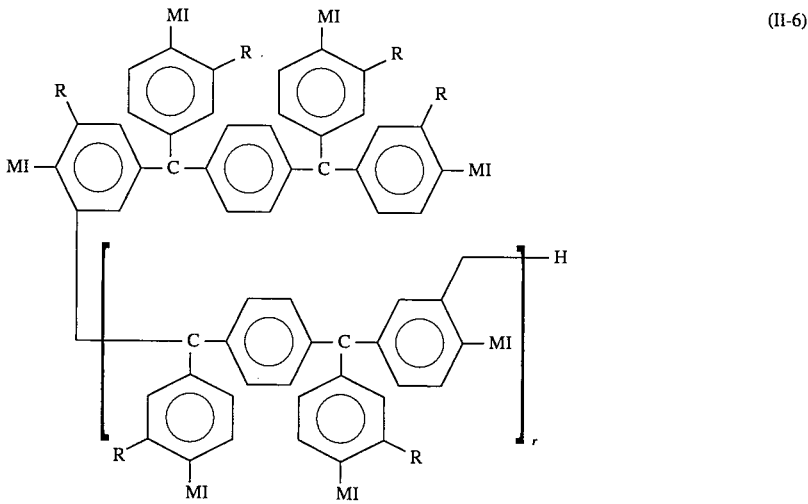 (II-6)

wherein MI=maleimide group, R=H or CH₃ and r=1–5, and (c) a diamine compound represented by formula (III):

$$H_2N-R^1-NH_2 \qquad (III)$$

wherein $R^1$ is a divalent aliphatic, aromatic, or alicyclic group,
or an amino-containing polysiloxane having a weight average molecular weight of 200–7,000 represented by the formula (IV):

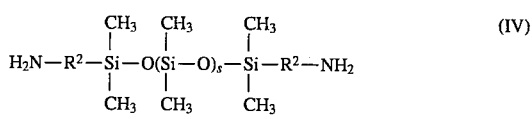

wherein $R^2$ is a divalent aliphatic, aromatic, or alicyclic group, and s is an integer of from 0 to 7,
the sum of components (b) and (c) based on 100 parts by weight of component (a) being 10 to 900 parts by weight, and the mol equivalent of the maleimide group in component (b) per mol equivalent of the amino group in component (c) being 1 to 100 mol equivalent, and said adhesive layer being composed of at least two semi-cured layers which are cured into a B-stage and have each a different status of semi-cure.

7. The adhesive tape for electronic parts as claimed in claim 6, wherein a release film is laminated on a surface of the adhesive layer.

8. The adhesive tape for electronic parts as claimed in claim 6, wherein 4 to 40% by weight of a filler having a particle size of not more than 1 μm is contained in the adhesive layer.

9. The adhesive tape for electronic parts as claimed in claim 6, wherein said adhesive layer cured into the B-stage is a laminate consisting of a semi-cured layer having a higher status of semi-cure in a range of 0.01–0.3 μm/sec of the slipping velocity and a semi-cured layer having a lower status of semi-cure in a range of 0.1–10.0 μm/sec of the slipping velocity, wherein the slipping velocity ($V_1$) of the semi-cured layer having a higher status of semi-cure and the slipping velocity ($V_2$) of the semi-cured layer having a lower status of semi-cure has the relation of $V_2 > V_1$.

10. The adhesive tape for electronic parts as claimed in claim 6, wherein said adhesive layer cured into the B-stage is a laminate consisting of the first semi-cured layer having a lower status of semi-cure in a range of 0.1–10.0 μm/sec of the slipping velocity, a semi-cured layer having a higher status of semi-cure in 0.3 μm/sec or less of the slipping velocity and the second semi-cured layer having a the slipping velocity, wherein the slipping velocity ($V_3$) of the semi-cured layer having a higher status of semi-cure, the slipping velocity ($V_4$) of the first semi-cured layer having a lower status of semi-cure and the slipping velocity ($V_5$) of the second semi-cured layer having a lower status of semi-cure have the relations of $V_4 > V_3$ and $V_5 > V_3$.

* * * * *